United States Patent

Nobori et al.

(10) Patent No.: US 7,948,735 B2
(45) Date of Patent: May 24, 2011

(54) ELECTROSTATIC CHUCK AND METHOD FOR MANUFACTURING THE SAME

(75) Inventors: Kazuhiro Nobori, Handa (JP); Yutaka Mori, Nagoya (JP); Keiichi Nakamura, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/410,683

(22) Filed: Mar. 25, 2009

(65) Prior Publication Data

US 2009/0243235 A1    Oct. 1, 2009

(30) Foreign Application Priority Data

Mar. 26, 2008  (JP) ................. 2008-082015

(51) Int. Cl.
*H01L 21/683*    (2006.01)
*H01T 23/00*    (2006.01)
*G03G 15/02*    (2006.01)
*H05F 3/00*    (2006.01)
*B23B 31/28*    (2006.01)

(52) U.S. Cl. ................. 361/234; 361/235; 279/128

(58) Field of Classification Search .......... 361/234–235; 279/128

See application file for complete search history.

(56) References Cited

U.S. PATENT DOCUMENTS

| | | | |
|---|---|---|---|
| 6,693,789 B2 * | 2/2004 | Inazumachi et al. ........ | 361/234 |
| 2005/0016986 A1 * | 1/2005 | Ito .................. | 219/444.1 |
| 2006/0213900 A1 | 9/2006 | Matsuda et al. | |
| 2008/0062610 A1 * | 3/2008 | Himori et al. ........... | 361/234 |

FOREIGN PATENT DOCUMENTS

| | | | |
|---|---|---|---|
| JP | 09-283607 A1 | | 10/1997 |
| JP | 10189698 | * | 7/1998 |
| JP | 2006-269826 A1 | | 10/2006 |

* cited by examiner

*Primary Examiner* — Dharti H Patel
(74) *Attorney, Agent, or Firm* — Burr & Brown

(57) ABSTRACT

The electrostatic chuck includes a base including an aluminum nitride-containing member; a dielectric layer formed on the base including a member having a volume resistivity of at least $1 \times 10^{15}$ Ω·cm at a temperature range of about 25° C. to about 300° C. and including 2 to 5% by mass of yttrium oxide, 2 to 5% by mass of ytterbium oxide, and a balance of aluminum nitride based on the total mass of the dielectric layer; and an electrode embedded under the dielectric layer so as to be positioned between the dielectric layer and the base, configured to generate an electrostatic absorption force.

5 Claims, 1 Drawing Sheet

US 7,948,735 B2

ELECTROSTATIC CHUCK AND METHOD FOR MANUFACTURING THE SAME

CROSS-REFERENCE TO RELATED APPLICATION AND INCORPORATION BY REFERENCE

This application claims benefit of priority under 35 USC 119 based on Japanese Patent Application P2008-82015, filed Mar. 26, 2008, the entire contents of which are incorporated by reference herein.

BACKGROUND OF THE INVENTION

1. Field of the Invention

The present invention relates to an electrostatic chuck and a method for manufacturing the same.

2. Description of the Related Art

In semiconductor or liquid crystal device manufacturing processes, electrostatic chucks have been used to adsorb and hold semiconductor substrates, glass substrates, or the like. Such electrostatic chucks include Coulomb force type chucks to adsorb substrates and Johnson-Rahbeck force type chuck to adsorb substrates. A Coulomb force is an electrostatic adsorption force generated between the electrode of an electrostatic chuck and a substrate placed on the surface of the dielectric layer of the electrostatic chuck. When an electrostatic chuck uses the Coulomb force to adsorb a substrate, the resistivity is required to be at a high level over the operating temperature range in order to provide appropriate substrate-releasing performance.

Alumina, which has high volume resistivity at room temperature and is inexpensive is generally used for electrostatic chucks that utilize a Coulomb force to adsorb substrates (see for example Japanese published Patent Application (JP-A) No. 09-283607)

In recent years, however, the temperature of the environment to which electrostatic chucks are exposed in semiconductor equipment has tended to increase. For example, electrostatic chucks have been used in the process of heating substrates in chemical vapor deposition (CVD) systems or the like or subjecting substrates to high-performance plasma treatment under a high heat input environment in etching systems or physical vapor deposition (PVD) systems to provide films of additional component materials, etching, and the like. Under these circumstances, electrostatic chucks have been required to have high thermal conductivity to improve thermal uniformity and/or efficiently transfer heat from substrates.

The thermal conductivity of alumina is at most 30 W/mK, which is relatively low. Therefore, electrostatic chucks having a base part made of alumina have a problem of insufficient heat transfer from substrates. Thus, the present inventors have proposed an electrostatic chuck that has a high level of volume resistivity and thermal conductivity when using Coulomb force in a high-temperature environment and also proposed a method for manufacturing such a chuck (see for example JP-A No. 2006-269826).

In general, Coulomb force-type electrostatic chucks are required to have the characteristics described below. However, the operating temperature of Coulomb force-type alumina electrostatic chucks has an upper limit of 200° C. In addition, alumina has a thermal conductivity of about 30 W/mk, and, therefore, it is difficult to provide a high level of thermal uniformity with alumina.

(1) Volume resistivity at room temperature and applied voltage of 2000 V: $1 \times 10^{16}$ Ω·cm or more (2) Volume resistivity at the upper limit of the operating temperature and applied voltage of 2000 V: $1 \times 10^{16}$ Ω·cm or more (3) Adsorption force: 20 Torr (2666 Pa) or more (at room temperature (RT) to the upper limit of the operating temperature)

SUMMARY OF THE INVENTION

According to a first aspect of the present invention, an electrostatic chuck includes a base including an aluminum nitride-containing member; a dielectric layer formed on the base including a member having a volume resistivity of at least $1 \times 10^{15}$ Ω·cm at a temperature range of about 25° C. to about 300° C. and including 2 to 5% by mass of yttrium oxide, 2 to 5% by mass of ytterbium oxide, and a balance of aluminum nitride based on the total mass of the dielectric layer; and an electrode embedded under the dielectric layer so as to be positioned between the dielectric layer and the base, configured to generate an electrostatic absorption force.

According to a second aspect of the present invention, a method is provided for manufacturing an electrostatic chuck, including the steps of forming a base including an aluminum nitride member; forming, on the base, an electrode to generate an electrostatic adsorption force, so as to expose the periphery of the base; and forming a dielectric layer, on the base so as to embed the electrode, the dielectric layer includes a member having a volume resistivity of $1 \times 10^{15}$ Ω·cm or greater at a range of about 25° C. to about 300° C. and consisting of 2 to 5% by mass of yttrium oxide, 2 to 5% by mass of ytterbium oxide, and a balance of aluminum nitride based on the total mass of the dielectric layer.

According to the present invention, an electrostatic chuck is provided that has high desorption response over a wide temperature range from low temperature to high temperature and has a high level of volume resistivity and thermal conductivity. A method for manufacturing the chuck is also provided.

DETAILED DESCRIPTION OF THE INVENTION

[Electrostatic Chuck]

Figure 1:
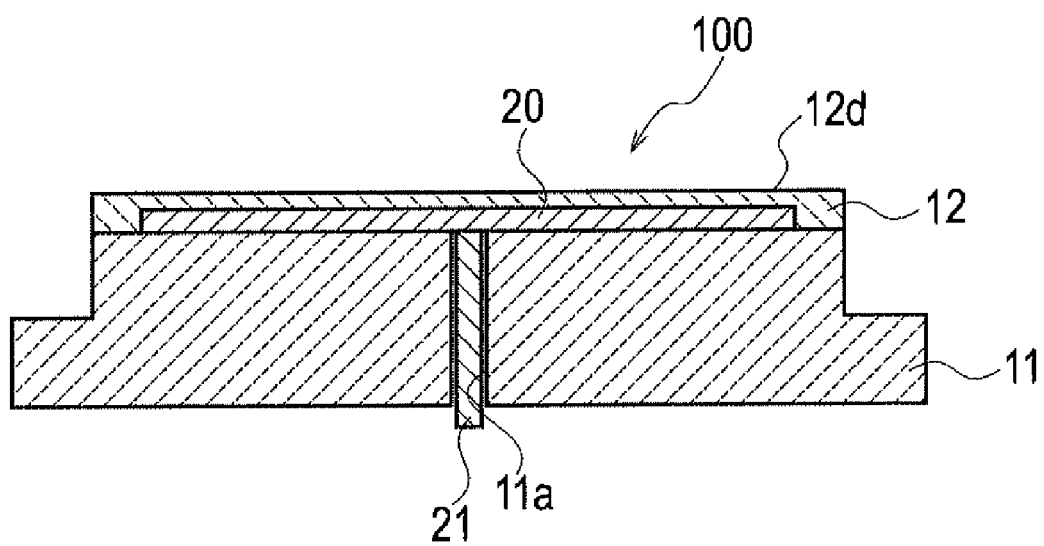
FIG. 1 illustrates a cross section of an electrostatic chuck according to an embodiment.

As shown in FIG. 1, an electrostatic chuck 100 according to an embodiment includes a base 11 including an aluminum nitride-containing member; a dielectric layer 12 formed on the base 11 including a member having a volume resistivity of at least $1 \times 10^{15}$ Ω·cm at a temperature range of about 25° C. to about 300° C. and including 2 to 5% by mass of yttrium oxide, 2 to 5% by mass of ytterbium oxide, and a balance of aluminum nitride based on the total mass of the dielectric layer; and an electrode 20 embedded under the dielectric layer 12 so as to be positioned between the dielectric layer 12 and the base 11, configured to generate an electrostatic absorption force. The base 11 is shaped as a plate such as a disc and has a hole 11a into which a terminal 21 is inserted. The terminal 21 is connected to the electrode 20 by soldering or the like.

The electrostatic chuck 100 as configured above enables the surface of the dielectric layer 12 (hereinafter referred to as the substrate contact surface 12d) to adsorb a substrate. The electrostatic chuck 100 also shows a high desorption response over a wide temperature range from low to high temperatures with a high level of volume resistivity and thermal conductivity.

(Base)

The base 11 preferably has a thermal conductivity of 80 W/mK or more, more preferably 150 W/mK or more. When the base 11 has such a high thermal conductivity, the heat release (transfer) performance is improved.

If the base 11 and the dielectric layer 12 do not have substantially the same thermal expansion coefficient, defects such as warping and dielectric layer delamination associated with warping may occur. In order to prevent such defects as warping, the base 11 and the dielectric layer 12 preferably have substantially the same thermal expansion coefficient.

The composition of the base 11 has no particular limitation, as long as the base 11 and the dielectric layer 12 have substantially the same thermal expansion coefficient. Preferably, the base 11 and the dielectric layer 12 are mainly composed of the same ceramic material, more preferably mainly composed of aluminum nitride, so that the base 11 and the dielectric layer 12 can have improved denseness. When made of sintered aluminum nitride, the base 11 preferably has a relative density of 98% or more, so that the base 11 can have improved denseness and insulation properties. To unify and simplify the use and management of raw material powders, the base 11 and the dielectric layer 12 are preferably made of the same material.

The base 11 may contain magnesia, yttria, titanium oxide, Samaria, alumina, yttribium, ceria, or the like as a sintering aid. However, the total amount of additional components other than the main material components should preferably be 10 wt % or less.

The base 11 and the dielectric layer 12 that are mainly composed of the same material may be integrally sintered with the electrode 20, so that the base 11, the electrode 20, and the dielectric layer 12 can become denser and more strongly adhere together. In a particularly preferred mode, the base 11, the electrode 20, and the dielectric layer 12 are integrally sintered by hot pressing.

(Dielectric Layer)

The dielectric layer 12 preferably includes aluminum nitride as the main component. Specifically, the dielectric layer is preferably composed of 2 to 5% by mass of yttrium oxide, 2 to 5% by mass of ytterbium oxide, and a balance of aluminum nitride, based on the total mass of the dielectric layer, so that high desorption response can be obtained over a wide temperature range from low temperature to high temperature, while a high level of volume resistivity and thermal conductivity can be maintained.

The dielectric layer 12 can generate a stronger Coulomb force between the substrate contact surface 12d and the substrate. In a high-temperature environment, therefore, the dielectric layer 12 enables the electrostatic chuck 100 to have a high volume resistivity and utilize Coulomb force.

The dielectric layer 12 preferably has a volume resistivity of $1\times10^{15}$ Ω·cm or more at a temperature range of about 25° C. to about 300° C. Specifically, when maintained in the temperature range of about 25° C. to about 300° C. in a vacuum, the dielectric layer 12 preferably has a volume resistivity of $1\times10^{15}$ Ω·cm or more, more preferably $1\times10^{16}$ Ω·cm or more, at a voltage of 2 kV/mm applied for 1 minute. For example, the temperature in the above temperature range may be, but not limited to, 25° C., 50° C., 100° C., 150° C., 200° C., 250° C., or 300° C.

When the dielectric layer 12 is made of sintered aluminum nitride, its relative density is preferably 98% or more. In this case, the dielectric layer 12 can be made denser. When the dielectric layer 12 is made of sintered aluminum nitride, its grain size is preferably 1.0 μm or less, so that the dielectric layer 12 can have a higher volume resistivity.

The dielectric layer 12 may contain magnesia, yttria, titanium oxide, or the like as a sintering aid. However, the total amount of additional components other than the main material components should preferably be 12 wt % or less.

The thickness of the dielectric layer 12 is preferably 0.5 mm or less, more preferably 0.4 mm or less, so that a strong electrostatic adsorption force can be obtained.

The centerline average surface roughness (Ra) (JIS B 0601) of the substrate contact surface 12d is preferably 1.6 μm or less, more preferably 0.8 μm or less, so that the adsorption force can be increased and that the gas leak rate can be reduced when backside gas is supplied to the backside of the substrate.

(Electrode)

The electrode 20 generates a Coulomb force between the substrate contact surface 12d and the substrate. In the electrostatic chuck 100, the electrode 20 is embedded between the base 11 and the dielectric layer 12. A refractory material such as tungsten (W), niobium (Nb), molybdenum (Mo), tantalum (Ta), hafnium (Hf), platinum (Pt), tungsten carbide (WC), and an alloy or compound thereof may be used to form the electrode 20. When the base 11 and the dielectric layer 12 are each mainly composed of aluminum nitride, the electrode may be made of molybdenum, tungsten, tungsten carbide or the like, which has a thermal expansion coefficient close to that of aluminum nitride and can provide good adhesion between the base 11 and the dielectric layer 12.

The electrode 20 may be, but not limited to, in the form of a mesh, a bulk, a sheet, or a comb. The electrode 20 may be not only in the form of a single electrode as shown in FIG. 1 but also in the form of double electrodes or separated into two or more parts.

The electrode 20 may be a print made from a print paste, a bulk electrode, a thin film formed by CVD or PVD, or the like.

The electrode 20 does not have to be placed between the base 11 and the dielectric layer 12. For example, the electrode 20 may be embedded in the dielectric layer 12.

The electrostatic chuck 100 may further include a resistance heater element embedded in the base 11 so that it can heat the substrate. Niobium, molybdenum, tungsten, or the like may be used to form the resistance heater element. The resistance heater element may be in the form of a line, a coil, a belt, a mesh, a film, or the like. The resistance heater element generates heat when supplied with electric current.

[Manufacturing Method]

The method for manufacturing the electrostatic chuck 100 includes the steps of forming the base 11 including an aluminum nitride member, followed by forming on the base 11, the electrode 20 to generate an electrostatic adsorption force, and then forming on the base 11, with the electrode 20 interposed therebetween, the dielectric layer 12 including a member having a volume resistivity of $1\times10^{15}$ Ω·cm or more at a temperature range of about 25° C. to about 300° C. and consisting of 2 to 5% by mass of yttrium oxide, 2 to 5% by mass of ytterbium oxide, and a balance of aluminum nitride based on the total mass of the dielectric layer. The method is described in detail below.

(A) First, a binder and optionally an organic solvent, a dispersing agent, or the like are added to a ceramic material powder and mixed to form a slurry. The components of the ceramic material powder and the ratio between the components are preferably as described above. The resulting slurry is granulated by a spray granulating method or the like to form granules.

(B) The resulting granules are shaped by a molding method such as die molding, cold isostatic pressing (CIP), or slip casting. The average particles size is preferably about 1 μm, so that sintering can be performed at a relatively low temperature.

(C) The resulting molded product is baked under conditions suitable for the ceramic material powder (including baking atmosphere, baking method, baking temperature, baking time, and the like) so that the base 11 is formed. Specifically, when aluminum nitride is used as the main component of the raw material powder, the molded product is preferably sintered at about 1400° C. to about 2000° C. in an atmosphere of inert gas such as nitrogen gas or argon gas, while pressurized in a uniaxial direction. If the baking temperature is lower than 1400° C., it may be difficult to form a dense product. If the baking temperature is higher than 2000° C., the volume resistivity may decrease. The baking temperature is more preferably from about 1600 to about 2000° C., at which the properties of the resulting base 11 can be more stabilized. The temperature is preferably raised at a rate of 200° C./hour or less to the maximum temperature. The maximum temperature is preferably maintained for 1 to 10 hours.

The baking method to be used is preferably, but not limited to, a hot press method. This method can produce densely sintered aluminum nitride so that the resulting sintered aluminum nitride can have a higher volume resistivity. In this case, a pressure of 10 to 30 MPa is preferably applied, so that a denser sintered material can be obtained as the base 11. For example, the molded product may be baked by holding it under a pressing pressure of 20 MPa at a maximum temperature of 1830° C. for 2 hours.

(D) The electrode 20 is then formed on the base 11 so as to expose periphery of the base 11. For example, the electrode 20 may be formed by printing a print paste in a semicircle, comb teeth, or a mesh on the surface of the base 11 by screen printing or the like. When the electrode 20 is formed by printing, a print paste produced by mixing a powder of a refractory material such as tungsten, niobium, molybdenum, or tungsten carbide, a ceramic powder of the same type as that for the base 11, and a binder such as a cellulose, acrylic, or polyvinyl butyral binder is preferably used, so that the electrode 20 can have a thermal expansion coefficient close to that of the base 11 and that the base 11 and the electrode 20 can be made denser.

Alternatively, a mesh electrode or a bulk electrode may be placed on the surface of the base 11. A thin film may also be formed by CVD or PVD as the electrode 20 on the surface of the base 11.

(E) The dielectric layer 12 is formed on the base 11 so as to embed the electrode 20 between the base 11 and the dielectric layer 12. Specifically, the base 11 including the electrode 20 is placed in a die or the like, and granules obtained in the same manner as in the process (B) are filled into the die and shaped into a molded product to form the dielectric layer 12 on the base 11. Alternatively, granules may be shaped by die press molding, CIP, slip casting, or the like so that a molded product to form the dielectric layer 12 is obtained. The molded product may be placed on the base 11 and pressed to form the dielectric layer 12.

(F) The molded product to form the base 11, the electrode 20 and the dielectric layer 12 is baked by hot pressing under baking conditions suitable for the ceramic material powder in the molded product (including baking atmosphere, baking method, baking temperature, baking time, and the like) so that an integrally sintered product is obtained. The dielectric layer 12 is formed by this process. When aluminum nitride is used as the main component of the raw material powder, the molded product is preferably sintered at about 1550° C. to about 2000° C. in an atmosphere of inert gas such as nitrogen gas or argon gas, while pressurized in a uniaxial direction. If the baking temperature is lower than 1550° C., it may be difficult to form a dense product. If the baking temperature is higher than 2000° C., the volume resistivity may decrease. The baking temperature is more preferably from about 1600 to about 2000° C., at which the volume resistivity of the resulting dielectric layer 12 can be more stable. The temperature is preferably raised at a rate of 200° C./hour or less to the maximum temperature. The maximum temperature is preferably maintained for 1 to 10 hours. A pressure of 10 to 30 MPa is preferably applied so that a denser sintered material can be obtained as the dielectric layer 12.

(G) The resulting integrally-sintered product is then further processed. Specifically, the dielectric layer 12 is preferably subjected to grinding so that the thickness of the dielectric layer 12 is adjusted to 0.5 mm or less. In addition, the dielectric layer 12 is preferably subjected to grinding so that the substrate contact surface 12*d* of the dielectric layer 12 can have a centerline average surface roughness (Ra) of 1.6 μm or less. A hole 11*a* for receiving a terminal 21 is also drilled into the base 11. Finally, the terminal 21 is inserted into the hole 11*a* of the base 11 and soldered to the electrode 20 so as to finalize production of the electrostatic chuck 100.

The electrostatic chuck 100 is manufactured by the process described above. Within the confines of the manufacturing conditions described above, the average particle size and composition of the raw material powder, and the baking conditions such as the baking temperature, the baking time, and the baking method may be controlled so that the composition, open porosity, bulk density, average particle size, and the like of the sintered product can be appropriately adjusted. As a result, the resulting electrostatic chuck can have an appropriately adjusted thermal conductivity, volume resistivity or the like.

Modified Embodiments

While the invention has been described with reference to the above embodiments, the description and the drawing that form part of the disclosure are not to be construed as limiting the invention. Various alternative embodiments, examples, and applied techniques may occur to those skilled in the art upon reviewing the disclosure herein.

Specifically, while a description has been given of a case where the manufacturing method according to the embodiment includes the steps of forming the base 11 and then forming the dielectric layer 12 on the base 11 with the electrode 20 placed therebetween, the sequence of the steps is not limited to that described above. For example, the method may include the steps of first forming the dielectric layer 12, then forming the electrode 20 on the dielectric layer 12, then forming a molded product for the base 11 on the dielectric layer 12 and the electrode 20, and integrally baking the components. The method including the steps of forming either the base 11 or the dielectric layer 12 by baking, then forming the electrode 20, and integrally baking the components can improve the flatness of the electrode 20, so that the electrostatic adsorption force uniformity and the thermal uniformity of the electrostatic chuck is improved.

Alternatively, a molded product to form the base 11 and another molded product to form the electrode 20 and the dielectric layer 12 that may be laminated, and then the resulting laminate may be integrally baked by hot pressing or the like.

The electrode 20 does not have to be placed between the base 11 and the dielectric layer 12. For example, the electrode 20 may be embedded in the dielectric layer 12.

It will be apparent that various embodiments other than those described herein are also encompassed by the invention. Therefore, the technical scope of the invention should be defined based on the essential elements according to the appended claims supported by the description.

EXAMPLES

The present invention is specifically described with the examples below which are not intended to limit the scope of the invention.

[Electrostatic Chucks]

Examples 1 to 19 and Comparative Example 1

Process of Preparing Base

Mixed powders were prepared, each containing yttrium oxide ($Y_2O_3$), ytterbium (Yb) oxide, and a balance of aluminum nitride powder produced by reduction nitridation in each composition ratio shown in Table 1 based on the total mass of each mixed powder. An acrylic resin binder was added to each mixed powder and mixed in a ball mill to form a slurry. The slurry was formed into granules by spray granulation. Specifically, the resulting slurry was spray-dried in a spray dryer to form granules.

The resulting granules were uniaxially press-molded into a sheet by die molding. The molded product was baked by hot pressing in a nitrogen gas atmosphere so that a sintered aluminum nitride product was obtained. Specifically, while pressurized at 20 MPa, the molded product was heated to the maximum temperature at a temperature increase rate of 10 to 150° C./hour and maintained at the maximum temperature for 2 hours. The maximum temperature was 1830° C. in the examples or 1700° C. in the comparative example. The sintered aluminum nitride product was shaped by grinding into a disk form with a diameter of 215 mm and a thickness of 10 mm.

(Process of Preparing Electrode)

A print paste was then prepared by mixing a tungsten carbide (WC) powder, a cellulose binder, an acrylic, polyvinyl butyral, and the like. Bipolar semicircular electrodes each with a diameter of 209 mm and a thickness of 20 µm were formed by screen printing of the print paste on the sintered aluminum nitride product and drying it. The bipolar electrodes were spaced 4 mm apart.

(Process of Forming Dielectric Layer)

The sintered aluminum nitride product provided with the electrodes was placed in a die. Aluminum nitride granules were filled into the die to be placed on the sintered aluminum nitride product and the electrodes and then press-molded.

The sintered aluminum nitride, the electrodes, and the molded aluminum nitride component were integrated into a molded product. The molded product was placed in a carbon sheath and baked in a nitrogen gas atmosphere by hot pressing. Specifically, the molded product was heated to a maximum temperature of 1700° C. at a temperature increase rate of 10° C./hour under a pressure of 20 MPa and maintained at the maximum temperature 1700° C. for 2 hours so that the components were integrally baked.

The surface of the dielectric layer was subjected to surface grinding with a diamond grinding wheel so that the thickness of the dielectric layer was set to 0.5 mm or less. As a result, the dielectric layer was completed.

The product was further subjected to grinding so that the substrate contact surface would have a centerline average surface roughness (Ra) of 0.8 µm or less. The side of the sintered aluminum nitride product was also subjected to grinding, and necessary drilling and joining a terminal to be connected to the electrodes were performed so that an electrostatic chuck was completed.

[Evaluations]

Each resulting electrostatic chuck was evaluated for the items (1) to (5) below.

(1) Measurement of Volume Resistivity

The volume resistivity was measured by the method according to JIS C 2141. Specifically, the measurement was performed under vacuum at temperatures of from room temperature to 400° C. Electrodes with a main electrode diameter of 20 mm, a guard electrode inner diameter of 30 mm, and a guard electrode outer diameter of 40 mm were each formed with a silver paste on the surface of the electrostatic chuck of 200 mm diameter×10 mm so as to prepare a test sample. A voltage of 2 kV/mm was applied to the electrodes on the electrostatic chuck, and one minute after the application of the voltage, the current was recorded and used to calculate its volume resistivity.

(2) Measurement of Thermal Conductivity

The thermal conductivity was measured at room temperature by the laser flash method according to JIS R 1611.

(3) Measurement of Desorption Response

The electrostatic chuck was placed in a vacuum chamber, and the pressure in the vacuum chamber was reduced to 1 Torr (133 Pa). In the vacuum chamber, a lamp heater was placed above the electrostatic chuck, so that the electrostatic chuck was heated to a predetermined temperature. A Si wafer was then placed on the substrate contact surface of the electrostatic chuck, and the lamp heater was turned on. After the temperature of the center of the wafer reached each preset temperature, the output of the lamp heater was kept constant for 1 minute, and then a DC voltage of ±500 V was applied to the electrostatic electrodes so that the Si wafer was adsorbed to the electrostatic chuck. After the adsorption of the wafer, backside gas was introduced to the backside of the wafer. After the backside gas pressure reached 5 Torr (675 Pa), the wafer was adsorbed for 1 minute, and then the DC voltage was set to 0 V (short circuit between the electrodes). After the voltage was set to 0 V, the time between desorption of the wafer from the electrostatic chuck and the steep reduction in the backside gas pressure was measured and defined as the desorption response (unit: second). When the preset temperature was 100° C., 200° C., 300° C., or 400° C., the desorption response was measured.

(4) Measurement of Adsorption Force

In vacuum, a silicon probe was brought into contact with the substrate contact surface of the electrostatic chuck, and a voltage of 2 kV/mm was applied between the electrode of the electrostatic chuck and the silicon probe so that the silicon probe was adsorbed and fixed onto the electrostatic chuck. While the voltage was applied, the silicon probe was pulled in a direction so as to be separated from the contact surface, 60 seconds after the start of the voltage application, and the force required to withdraw the probe from the surface was measured as the adsorption force. The front end of the silicon probe had an area of 3 $cm^2$, and the measurement was performed at 23° C., 100° C., 200° C., 300° C., and 400° C.

(5) Measurement of Thermal Uniformity

A Si wafer was placed on the contact surface of the electrostatic chuck, and a DC voltage of ±500 V was applied to the electrostatic electrodes so that the Si wafer was adsorbed to the chuck. White the wafer was adsorbed to the chuck, the tamp heater was turned on. After the temperature of the center of the wafer reached each preset temperature, the output of the tamp heater was kept constant for 1 minute, and then the heating was stopped. Immediately after stopping the heating, temperature distribution on the wafer surface was measured using TC Wafer. The difference ΔT between the maximum and minimum temperatures on TC Wafer was defined as the thermal uniformity (unit: ° C.). The smatter the ΔT value, the better thermal uniformity, for example, which allows uniform etching of wafers by an etching process or the like. The preset temperature was 100° C., 200° C., 300° C., or 400° C., when the thermal uniformity was measured.

The results of the evaluation of items (1) and (2) are shown in Tables 1A and 1B and the results of the evaluation of items (3), (4), and (5) are shown in Tables 2, 3, and 4, respectively. In Table 1A and 1B, "O" indicates that the volume resistivity was evaluated as being $1 \times 10^{15}$ Ω·cm or more, and "x" indicates that the volume resistivity was evaluated as being less than $1 \times 10^{15}$ Ω·cm.

TABLE 1A

|  | Thermal conductivity (W/m · K) | Volume resistivity | | | | | Evaluation |
|---|---|---|---|---|---|---|---|
|  |  | 23° C. | 100° C. | 200° C. | 300° C. | 400° C. |  |
| Comparative Example 1 Alumina | 33 | E17 | E17 | 5.00E+15 | 1.00E+14 | — | X |
| Comparative Example 2 ALN + 3% Y2O3 | 170 | 6.60E+16 | 1.50E+15 | 2.30E+13 | 5.20E+11 | 1.60E+10 | X |
| Comparative Example 3 ALN + 5% Yb2O3 | 171 | 3.20E+16 | 2.30E+15 | 7.80E+13 | 1.90E+12 | 3.40E+10 | X |
| Comparative Example 4 ALN + 1% Y2O3 + 2% Yb2O3 | 152 | 3.60E+14 | 8.40E+13 | 1.30E+13 | 1.30E+12 | 1.40E+10 | X |
| Comparative Example 5 ALN + 1% Y2O3 + 5% Yb2O3 | 154 | 2.10E+14 | 1.10E+14 | 2.10E+13 | 2.10E+12 | 2.30E+10 | X |
| Comparative Example 6 ALN + 2% Y2O3 + 1% Yb2O3 | 173 | 4.30E+16 | 1.60E+15 | 9.20E+14 | 8.50E+13 | 4.40E+11 | X |
| Example 1 ALN + 2% Y2O3 + 2% Yb2O3 | 175 | 5.10E+16 | 1.10E+16 | 9.80E+15 | 1.50E+15 | 3.20E+12 | O |
| Example 2 ALN + 2% Y2O3 + 5% Yb2O3 | 177 | 7.90E+16 | 1.30E+16 | 9.90E+15 | 3.20E+15 | 3.40E+12 | O |
| Comparative Example 7 ALN + 2% Y2O3 + 6% Yb2O3 | 170 | 5.40E+16 | 2.70E+16 | 1.10E+15 | 9.50E+13 | 2.10E+11 | X |
| Comparative Example 8 ALN + 3% Y2O3 + 0.5% Yb2O3 | 175 | 3.60E+16 | 1.90E+15 | 9.60E+14 | 2.30E+12 | 2.60E+10 | X |
| Comparative Example 9 ALN + 3% Y2O3 + 1% Yb2O3 | 185 | 4.60E+16 | 1.50E+15 | 8.90E+14 | 9.20E+13 | 5.90E+11 | X |

TABLE 1B

|  | Thermal conductivity (W/m · K) | Volume resistivity | | | | | Evaluation |
|---|---|---|---|---|---|---|---|
|  |  | 23° C. | 100° C. | 200° C. | 300° C. | 400° C. |  |
| Example 3 ALN + 3% Y2O3 + 2% Yb2O3 | 188 | 1.00E+17 | 1.00E+17 | 1.20E+16 | 1.60E+15 | 5.40E+12 | O |
| Example 4 ALN + 3% Y2O3 + 5% Yb2O3 | 190 | 1.20E+17 | 1.00E+17 | 2.10E+16 | 3.20E+15 | 6.20E+12 | O |
| Comparative Example 10 ALN + 3% Y2O3 + 6% Yb2O3 | 182 | 8.30E+16 | 4.30E+16 | 1.40E+15 | 1.20E+14 | 3.40E+11 | X |
| Comparative Example 11 ALN + 5% Y2O3 + 1% Yb2O3 | 186 | 4.80E+16 | 1.70E+15 | 9.10E+14 | 2.60E+12 | 2.70E+10 | X |
| Example 5 ALN + 5% Y2O3 + 2% Yb2O3 | 187 | 9.20E+16 | 8.30E+16 | 1.10E+16 | 1.30E+15 | 3.30E+12 | O |
| Example 6 ALN + 5% Y2O3 + 5% Yb2O3 | 191 | 9.80E+16 | 8.90E+16 | 1.90E+16 | 3.10E+15 | 3.70E+12 | O |
| Comparative Example 12 ALN + 5% Y2O3 + 6% Yb2O3 | 183 | 8.40E+16 | 4.50E+16 | 1.50E+15 | 1.20E+14 | 3.70E+11 | X |
| Comparative Example 13 ALN + 6% Y2O3 + 2% Yb2O3 | 168 | 5.50E+15 | 2.80E+14 | 3.30E+13 | 1.10E+11 | 1.50E+10 | X |
| Comparative Example 14 ALN + 6% Y2O3 + 5% Yb2O3 | 171 | 5.60E+15 | 3.10E+14 | 3.00E+13 | 2.10E+11 | 1.70E+10 | X |

TABLE 2

| | Desorption response (s) | | | | |
|---|---|---|---|---|---|
| | 23° C. | 100° C. | 200° C. | 300° C. | 400° C. |
| Comparative Example 1 | 1 | 1 | 1 | 60 | — |
| Examples 1, 2 | 1 | 1 | 1 | 1 | 1 |
| Examples 3, 4 | 1 | 1 | 1 | 1 | 1 |
| Examples 5, 6 | 1 | 1 | 1 | 1 | 1 |

TABLE 3

| | Adsorption force (Torr) | | | | |
|---|---|---|---|---|---|
| | 23° C. | 100° C. | 200° C. | 300° C. | 400° C. |
| Comparative Example 1 | ≧20 | ≧20 | ≧20 | ≧20 | — |
| Examples 1, 2 | ≧20 | ≧20 | ≧20 | ≧20 | ≧20 |
| Examples 3, 4 | ≧20 | ≧20 | ≧20 | ≧20 | ≧20 |
| Examples 5, 6 | ≧20 | ≧20 | ≧20 | ≧20 | ≧20 |

TABLE 4

| | Thermal uniformity (° C.) | | | |
|---|---|---|---|---|
| | 100° C. | 200° C. | 300° C. | 400° C. |
| Comparative Example 1 | 4 | 5 | 7 | — |
| Examples 1, 2 | 1 | 1 | 1 | 2 |
| Examples 3, 4 | 1 | 1 | 1 | 2 |
| Examples 5, 6 | 1 | 1 | 1 | 2 |

Tables 1A and 1B show that when the dielectric layer 12 includes 2 to 5% by mass of yttrium oxide ($Y_2O_3$), 2 to 5% by mass of ytterbium oxide ($Yb_2O_3$), and a balance of aluminum nitride (AlN) based on the total mass of the dielectric layer, a high level of thermal conductivity and volume resistivity are exhibited.

Table 2 shows that in each example where the volume resistivity was at least $1\times10^{15}$ Ω·cm, the desorption response was 1 second, and a very high desorption response was exhibited over a wide temperature range from room temperature to 300° C.

Table 3 shows that the comparative example and the examples all generated practically sufficient adsorption force at temperatures of up to 300° C., but in the comparative example, heating to 400° C. caused cracking which made it impossible to obtain each item of data. This indicates that according to the examples, a high level of adsorption force can be produced over a wide temperature range.

Table 4 shows that the thermal uniformity of each example of the invention was much better than that of the alumina electrostatic chuck of the comparative example. This may be because, in the examples of the invention, aluminum nitride has not only high resistivity when compared to that of alumina but is also high in thermal conductivity.

It is empirically known that in general, there is a close connection between the thermal conductivity and the color of ceramics, and the deeper the color, the better the conduction or release (transfer) of heat. When observed visually, the electrostatic chuck of each example had a light violet color (relatively deep color) with a hue of 5P and a value/chroma ratio of 8 to 6/1 to 4 based on the three attributes of color according to JIS 8721. As a result of the visual observation, therefore, it is suggested that the electrostatic chuck of each example should exhibit good conduction and transfer of heat so that temperature decrease can be prevented at the ceramic portion between the patterned electrodes. A similar tendency was found between the result of the visual observation and the result of the thermal uniformity test shown in Table 4.

What is claimed is:

1. An electrostatic chuck, comprising:
   a base including an aluminum nitride-containing member;
   a dielectric layer formed on the base including a member having a volume resistivity of at least $1\times10^{15}$ Ω·cm at all temperatures within a temperature range of about 25° C. to about 300° C. and including 2 to 5% by mass of yttrium oxide, 2 to 5% by mass of ytterbium oxide, and a balance of aluminum nitride based on the total mass of the dielectric layer; and
   an electrode embedded under the dielectric layer so as to be positioned between the dielectric layer and the base, configured to generate an electrostatic absorption force.

2. The electrostatic chuck of claim 1, wherein the dielectric layer has a thermal conductivity of at least 180 W/mK.

3. An electrostatic chuck, comprising:
   a base;
   a dielectric layer formed on the base; and
   an electrode embedded under the dielectric layer so as to be positioned between the dielectric layer and the base, configured to generate an electrostatic absorption force, wherein
   the base and the dielectric layer each include a member having a volume resistivity of at least $1\times10^{15}$ Ω·cm at all temperatures within a temperature range of about 25° C. to about 300° C. and including 2 to 5% by mass of yttrium oxide, 2 to 5% by mass of ytterbium oxide, and a balance of aluminum nitride based on the total mass of the base or the dielectric layer.

4. The electrostatic chuck of claim 3, wherein the base and the dielectric layer each have a thermal conductivity of at least 180 W/mK.

5. A method for manufacturing an electrostatic chuck, comprising:
   forming a base including an aluminum nitride member;
   forming, on the base, an electrode to generate an electrostatic adsorption force, so as to expose periphery of the base; and
   forming a dielectric layer, on the base so as to embed the electrode, the dielectric layer includes a member having a volume resistivity of at least $1\times10^{15}$ Ω·cm at all temperatures within a temperature range of about 25° C. to about 300° C. and including 2 to 5% by mass of yttrium oxide, 2 to 5% by mass of ytterbium oxide, and a balance of aluminum nitride based on the total mass of the dielectric layer.

* * * * *